(12) United States Patent
Yang et al.

(10) Patent No.: US 11,842,788 B2
(45) Date of Patent: Dec. 12, 2023

(54) METHOD FOR DETERMINING REPAIR LOCATION FOR REDUNDANCY CIRCUIT, METHOD FOR REPAIRING INTEGRATED CIRCUIT, ELECTRONIC DEVICE AND STORAGE MEDIUM

(71) Applicant: CHANGXIN MEMORY TECHNOLOGIES, INC., Hefei (CN)

(72) Inventors: Lei Yang, Hefei (CN); Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/649,192

(22) Filed: Jan. 27, 2022

(65) Prior Publication Data

US 2022/0165351 A1      May 26, 2022

Related U.S. Application Data

(63) Continuation of application No. PCT/CN2021/109067, filed on Jul. 28, 2021.

(30) Foreign Application Priority Data

Nov. 26, 2020   (CN) .......................... 202011350461.3

(51) Int. Cl.
*G11C 29/00*      (2006.01)
(52) U.S. Cl.
CPC .......... *G11C 29/785* (2013.01); *G11C 29/808* (2013.01)

(58) Field of Classification Search
CPC . G11C 29/785; G11C 29/808; G11C 29/4401; G11C 29/56008
See application file for complete search history.

(56) References Cited

U.S. PATENT DOCUMENTS

| 2013/0083612 A1* | 4/2013 | Son | G11C 29/4401 365/200 |
| 2014/0146624 A1* | 5/2014 | Son | G06F 11/1048 365/200 |
| 2022/0366996 A1* | 11/2022 | Chiang | G11C 29/42 |

* cited by examiner

*Primary Examiner* — Mohammed A Bashar
(74) *Attorney, Agent, or Firm* — SYNCODA LLC; Feng Ma

(57) ABSTRACT

A method and an apparatus for determining a repair location for a redundancy circuit, and a method for repairing an integrated circuit are provided. At least one fail bit of a chip to be repaired is determined. At least one initial repair location for the redundancy circuit is initially assigned according to the at least one fail bit. At least one potential fail line is determined according to the at least one initial repair location. At least one predicted repair location is determined according to the at least one potential fail line. Each of the at least one predicted repair location is a location with a higher probability that a new fail bit appears. At least one final repair location for the redundancy circuit is determined according to the at least one fail bit and the at least one predicted repair location.

20 Claims, 15 Drawing Sheets

METHOD FOR DETERMINING REPAIR LOCATION FOR REDUNDANCY CIRCUIT, METHOD FOR REPAIRING INTEGRATED CIRCUIT, ELECTRONIC DEVICE AND STORAGE MEDIUM

CROSS-REFERENCE TO RELATED APPLICATIONS

This is a continuation of International Application No. PCT/CN2021/109067 filed on Jul. 28, 2021, which claims priority to Chinese patent application No. 202011350461.3 filed on Nov. 26, 2020. The disclosures of these applications are hereby incorporated by reference in their entirety.

BACKGROUND

With a rapid development of computer technologies, integrated circuit chips are playing an increasing role in people's production and life. The fail of the chip during a process of development, production and usage is inevitable, and a redundancy circuit can usually be used to repair fail bits in the chip.

SUMMARY

The embodiments of the present disclosure relate to the field of integrated circuit technologies, and provide a method for determining a repair location for a redundancy circuit, a method for repairing an integrated circuit, an electronic device, and a storage medium.

According to a first aspect of the present disclosure, a method for determining a repair location for a redundancy circuit is provided. The method includes the following operations.

At least one fail bit of a chip to be repaired may be determined.

At least one initial repair location for the redundancy circuit may be assigned according to the at least one fail bit.

At least one potential fail line may be determined according to the at least one initial repair location.

At least one predicted repair location may be determined according to the at least one potential fail line.

At least one final repair location for the redundancy circuit may be determined according to the at least one fail bit and the at least one predicted repair location.

According to a second aspect of the present disclosure, an electronic device is provided. The electronic device includes a processor and a memory.

The memory may be configured to store one or more programs that, when executed by the processor, cause the processor to implement a method for determining the repair location for the redundancy circuit comprising: determining at least one fail bit of a chip to be repaired; assigning at least one initial repair location for the redundancy circuit according to the at least one fail bit; determining at least one potential fail line according to the at least one initial repair location; determining at least one predicted repair location according to the at least one potential fail line; and determining at least one final repair location for the redundancy circuit according to the at least one fail bit and the at least one predicted repair location.

According to a third of the present disclosure, a method for repairing an integrated circuit. The method includes the following operations. At least one final repair location for a redundancy circuit is determined according to the method for determining the repair location for the redundancy circuit in the first aspect. A chip to be repaired is repaired according to the at least one final repair location.

According to a fourth aspect of the present disclosure, a non-transitory computer-readable storage medium is provided. The non-transitory computer-readable storage medium having stored thereon a computer program that, when executed by a processor, may cause the processor to perform a method for determining the repair location for the redundancy circuit comprising: determining at least one fail bit of a chip to be repaired; assigning at least one initial repair location for the redundancy circuit according to the at least one fail bit; determining at least one potential fail line according to the at least one initial repair location; determining at least one predicted repair location according to the at least one potential fail line; and determining at least one final repair location for the redundancy circuit according to the at least one fail bit and the at least one predicted repair location.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification. These drawings show embodiments in accordance with the present disclosure, and are used to explain the principle of the present disclosure together with the specification. Obviously, the drawings in the following description are only some embodiments of the present disclosure. For those skilled in the art, other drawings can be obtained based on these drawings without any creative effort.

DETAILED DESCRIPTION

Figure 1:
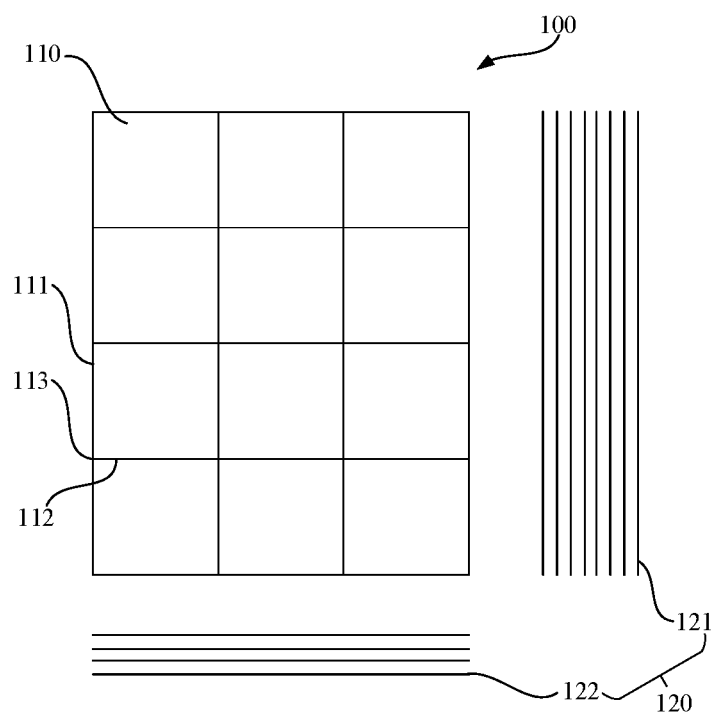
FIG. 1 schematically illustrates a structural diagram of a chip according to an exemplary embodiment of the present disclosure.

Exemplary embodiments will now be described more fully with reference to the accompanying drawings. However, the exemplary embodiments can be implemented in various forms, and should not be construed as being limited to the examples set forth herein. On the contrary, the provision of these embodiments makes the present disclosure more comprehensive and complete, and fully conveys the concept of the exemplary embodiments to those skilled in the art. The same reference numerals in the figures indicate the same or similar structures, and thus their detailed descriptions will be omitted.

Although relative terms such as "above" and "under" are used in this specification to describe the relative relationship between one component and another component of an icon, these terms are used in this specification only for convenience, for example, the direction of the example described in the drawings. It can be understood that if the apparatus of the icon is turned over to make it turned upside down, the described "above" component will become the "under" component. Other relative terms, such as "high", "low", "top", "bottom", "left" and "right" have similar meanings. When a structure is "above" another structure, it may mean that a certain structure is integrally formed on other structures, or that a certain structure is "directly" installed on other structures, or that a certain structure is "indirectly" installed on other structures through another structure.

The terms "a/an", "one", and "said" are used to indicate that there are one or more elements/components, etc. The terms "include" and "have" are used to indicate an open-ended meaning of inclusion and mean that there may be other elements/components/divisions, etc., besides the listed elements/components/divisions, etc.

Some implementations usually obtain assigned repair locations for all redundancy circuits by analysis operations of the redundancy circuits, and repair the fail bits according to the above repair locations.

However, after fusing and repairing the fail bits according to the above repair locations, new fail bits often appear, and these new fail bits often cause the chip to be scrapped because the chip can no longer be repaired, thereby reducing the process yield of the chips.

In a chip, there are usually multiple cells. For example, a typical dynamic random access memory chip has as many as 64 million cells. These cells can be arranged in rows and columns into a main array so as to facilitate addressing through word lines and bit lines.

During a manufacturing process of a typical dynamic random access memory chip, it may happen that one million or even millions of cells in the main array have defects, that is, so-called fail bits. In order to improve the yield of the chip, redundancy circuits are usually made on the chip. These redundancy circuits can replace the word line or the bit line where the defective fail bit is located, thereby bypassing these defective fail bits and allowing the memory circuit to be used normally.

Generally, after a fail bit is generated during a process of development, production and usage of a chip, all of the fail bits can be detected by a circuit probe testing technology, and the redundancy circuits in the chip can be assigned through analysis operations of the redundancy circuit, so as to repair the above fail bits.

However, after the above fail bits are repaired using the assigned redundancy circuit through a fuse technology, new fail bits appear. These new fail bits are valid locations when being detected by the above circuit probe testing technology. If these new fail bits are detected in the final product test before shipment, the chips containing the new fail bits will be scrapped directly, which will reduce the process yield of the produce. If these new fail bits are not detected before shipment, it may lead to the chip fail during use, thereby reducing product quality, improving after-sales warranty cost and lowering user experience.

Based on this, this exemplary embodiment provides a method and an apparatus for determining a repair location of a redundancy circuit, and a method for repairing an integrated circuit.

FIG. 1 illustrates a structural diagram of a chip according to an exemplary embodiment of the present disclosure. A chip 100 usually includes a normal cell region 110 and a redundancy cell region 120. The normal cell region 110 contains more cells. The normal cell region 110 includes two orthogonal lines, i.e., a word line 111 and a bit line 112. The word line 111 is a column line, and the bit line 112 is a row line. At the same time, in addition to the normal cell region 110, the chip 100 is also provided with the redundancy cell region 120 containing redundancy cells. The redundancy cell region 120 includes two orthogonal straight lines, i.e., a redundancy word line (RWL) 121 and a redundancy bit line (RBL) 122. The redundancy word line 121 is a column line and is used to repair fail bits on the word line 111, and the redundancy bit line 122 is a row line and is used to repair fail bits on the bit line 112.

Figure 2:
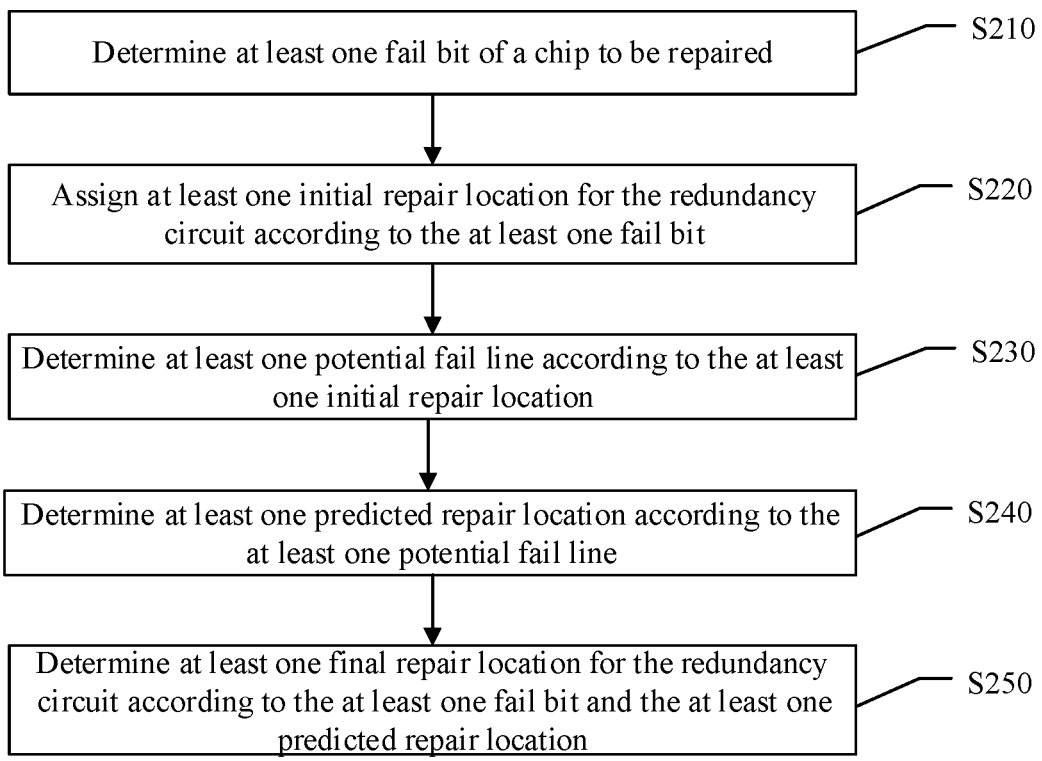
FIG. 2 schematically illustrates a flow chart of a method for determining a repair location for a redundancy circuit according to an exemplary embodiment of the present disclosure.

FIG. 2 schematically illustrates a flow chart of a method for determining a repair location for a redundancy circuit according to an exemplary embodiment of the present disclosure. Please refer to FIG. 2, the method for determining the repair location for the redundancy circuit includes the following operations.

At an operation S210, at least one fail bit of a chip to be repaired is determined.

At an operation S220, at least one initial repair location for the redundancy circuit is assigned according to the at least one fail bit.

At an operation S230, at least one potential fail line is determined according to the at least one initial repair location.

At an operation S240, at least one predicted repair location is determined according to the at least one potential fail line.

At an operation S250, at least one final repair location for the redundancy circuit is determined according to the at least one fail bit and the at least one predicted repair location.

According to the method for determining the repair location for the redundancy circuit in this exemplary embodiment, at one aspect, by determining the fail bit of a chip to be repaired, at least one initial repair location for the redundancy circuit is initially assigned according to the at least one fail bit and at least one potential fail line is determined according to the at least one initial repair location, and then at least one predicted repair location is determined according to the at least one potential fail line. The at least one predicted repair location is at least one location where a new fail bit has a higher probability of appearing, and at least one final repair location for the redundancy circuit is determined according to the at least one fail bit and the at least one predicted repair location. In this way, the at least one fail bit and the at least one predicted repair location where a new fail bit may appear can be simultaneously determined as the repair location that needs to be repaired, so that the new fail bit can be repaired before it appears, thereby reducing the probability of appearing the new fail bit and improving the process yield of the chip, while improving the quality of the chip, reducing the cost of after-sales warranty, and improving the user experience. At another aspect, by determining the at least one predicted repair location before the repair is performed, the fail bit and a location where a new fail bit may appear can be repaired at the same time, thereby saving man-hours for repairing and saving repair costs. At another aspect, the above fail bit repair solution can increase the probability that all fail bits are repaired after performing one repair, reduce the probability that fail bits in the chip cannot be repaired, thereby effectively improving the process yield of the chip and reducing the occurrence that the chip is scrapped.

Hereinafter, the method for determining the repair location for the redundancy circuit in this exemplary embodiment will be further explained.

At an operation S210, at least one fail bit of a chip to be repaired is determined.

In some exemplary embodiments of the present disclosure, as illustrated in FIG. 1, a fail bit 113 is a location in the normal cell region 110, and the fail bit 113 is on the word line 111 or the bit line 112, so the fail bit 113 can be repaired by replacing the word line 111 with the redundancy word line 121, or the fail bit 113 can be repaired by replacing the bit line 112 with the redundancy bit line 122. The specific repair scheme can be determined by referring to the existing repair schemes of the redundancy circuit.

At an operation S220, at least one initial repair location for the redundancy circuit is assigned according to the at least one fail bit.

In practical applications, for a case where multiple fail bits are located on the same word line 111, only one redundancy word line 121 may be needed for repair these fail bits, and for a case where multiple fail bits are located on the same bit line 112, only one redundancy bit line 122 may be needed for repair these fail bits.

Figure 3:
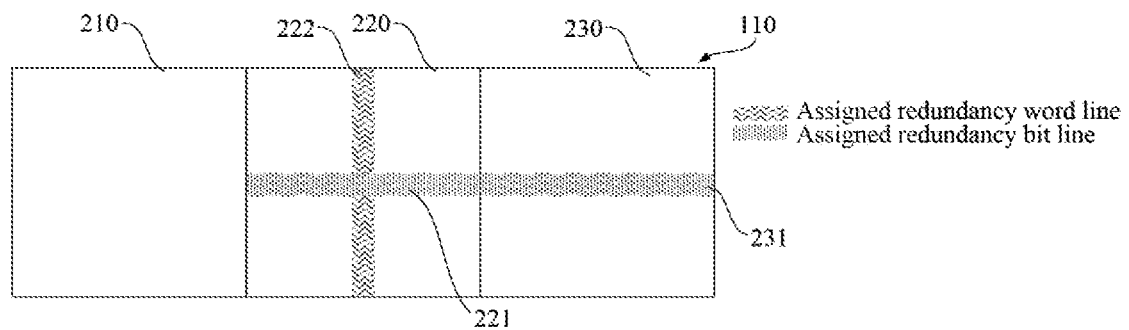
FIG. 3 schematically illustrates a schematic diagram of at least one initial repair location for a redundancy circuit according to an exemplary embodiment of the present disclosure.

According to the existing repair schemes for the redundancy circuit, the at least one initial repair location for the redundancy circuit is preliminarily determined, so as to determine whether the fail bit on the chip 100 to be repaired is repaired by the redundancy word line 121 or the redundancy bit line 122. As an example, FIG. 3 schematically illustrates a schematic diagram of at least one initial repair location for a redundancy circuit. Referring to FIG. 3, the normal cell region 110 is divided into multiple regions, for example, a first region 210, a second region 220, a third region 230. Exemplarily, it is assumed that there is no fail bit in first region 210, and there are multiple fail bits in the second region 220, one bit line 221 in the second region 220 contains 3 fail bits (FB for short), and there are two specific test items (Bin for short) "a" and "h". Specifically, one fail bit among these three fail bits belongs to the test item "a", and the remaining two fail bits belongs to the test item "h". The locations of these three fail bits (which belongs to Bin=a, 2 h) are not adjacent, that is, the arrangement shape of these fail bits is that each fail bit is arranged in a form of a single bit. Furthermore, it is assumed that one word line 222 in the second region 220 contains four fail bits, and there are three test items "a", "b", and "i". Specifically, two fail bits among these four fail bits belong to the test item "a" and the test item "b" respectively, and the remaining two fail bits belong to the test item "i". When any two fail bits in these four fail bits are adjacent to each other, that is, when any two fail bits in these four fail bits are arranged in a linear shape, the at least one initial repair location is determined according to the above multiple fail bits. The redundancy word line 121 is assigned to repair the word line 222, and the redundancy bit line 122 is assigned to repair the bit line 221. Furthermore, it is assumed that there is one fail bit in the third region 230, and this fail bit is on the bit line 231, this bit line 231 contains one fail bit, there is one test item "a", this fail bit is arranged as a single point, and therefore, the redundancy bit line 122 is assigned to repair the bit line 231, a location of which is used as the initial repair location.

It should be noted that the at least one initial repair location for the redundancy circuit determined here does not mean that the assigned redundancy word line 121 or the assigned redundancy bit line 122 will eventually be used to repair the above listed fail bits.

At an operation S230, at least one potential fail line is determined according to the at least one initial repair location.

In some exemplary embodiments of the present disclosure, a potential fail line refers to a line where a new fail bit may appear after the fail bit in the chip 100 is repaired according to the at least one initial repair location determined at the operation S220. The embodiments of the present disclosure can predict the location where the new fail bit appears by determining the at least one potential fail line, so that the at least one potential fail line can also be repaired when the repair is officially carried out, thereby reducing the probability of the occurrence of the new fail bit and improving the process yield of the chip.

In practical applications, there are many ways to determine the at least one potential fail line according to the at least one initial repair location. For example, the at least one potential fail line is determined based on the historical data of the new fail bit of the scrapped chip in the past, but potential fail lines determined by this method are highly dispersed, and data statistics need to be performed on each line, which requires a large amount of data support.

Optionally, in some exemplary embodiments of the present disclosure, the operation of determining the at least one potential fail line according to the at least one initial repair location may include determining the at least one potential fail line according to the repair location attribute of the at least one initial repair location. By determining the at least one potential fail line according to the location attribute of the at least one initial repair location, the possible location that the new fail bit appears can be determined without the support of a large amount of data that is required in the past, so that the efficiency of determining the at least one potential fail line can be improved.

In practical applications, the repair location for each of the assigned redundancy circuit usually has a lot of information, such as a category of a product portfolio, a type of the redundancy circuit, the number of fail bits, at least one test item, an arrangement shape of the fail bits, and the other repair location attributes.

Since factors that cause different types of chips to generate new fail bits are different, it is necessary to classify the chips according to the attributes of the chips, so as to classify the products according to the categories and determine the category of the product portfolio. The type of the redundancy circuit refers to the redundancy word line 121 and the redundancy bit line 122. The number of the fail bits refers to the number of fail bits existing in the assigned redundancy word line 121 or the assigned redundancy bit line 122. The at least one test item refers to multiple test items that are carried out when the circuit probe is testing the fail bit, these test items sequentially detect each cell that has not been tested or has passed the previous test to determine whether the location is a fail bit. The arrangement shape of the fail bits may be a linear or a single point. The linear refers to a shape of fail bits that are consecutively adjacent, and the single point refers to a shape of fail bits that are not consecutively adjacent.

In some exemplary embodiments of the present disclosure, two repair location attributes associated with the above location information are proposed, i.e., a number and distance attribute, and a fail bit attribute. The at least one potential fail line may be determined according to the number and distance attribute of the at least one initial repair location, and the at least one potential fail line may also be determined according to the fail bit attribute of the at least one initial repair location.

The operation that the at least one potential fail line is determined according to the number and distance attribute of the at least one initial repair location specifically includes the following operations. In response to determining that a number of initial repair locations which serve as word lines or bit lines among the at least one initial repair location is greater than or equal to two and a distance between two adjacent initial repair locations among the initial repair locations is less than or equal to three cells, at least one word line or at least one bit line adjacent to any one of the two adjacent initial repair locations is determined as the at least one potential fail line.

That is to say, in response to determining that there are at least two initial repair locations which serve as word lines and need to be repaired by redundancy word lines 121 and a distance between two adjacent initial repair locations is less than or equal to three cells, a word line adjacent to any one of the two initial repair locations is determined as the potential fail line. In response to determining that there are at least two initial repair locations which serve as bit lines and need to be repaired by redundancy bit lines 122 and a distance between two adjacent initial repair locations is less than or equal to three cells, a bit line adjacent to any one of the two initial repair locations is determined as the potential fail line.

Figure 4:
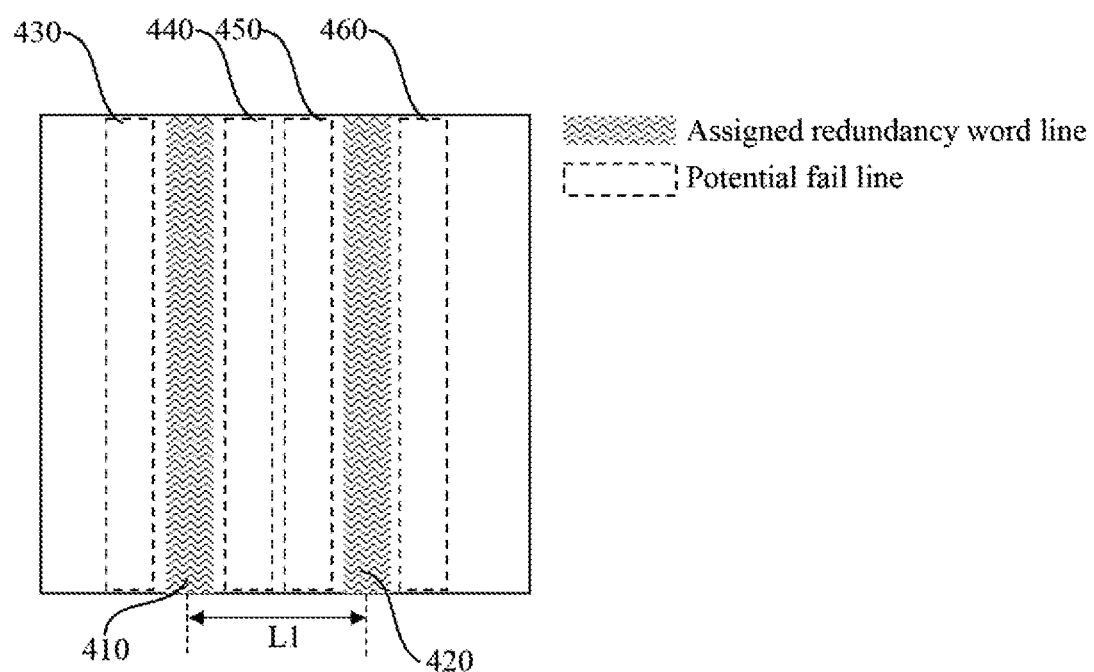
FIG. 4 schematically illustrates a first schematic diagram of determining a location of each of at least one potential fail line by a number and distance attribute of at least one initial repair location according to an exemplary embodiment of the present disclosure.

As an example, FIG. 4 schematically illustrates a first schematic diagram of determining a location of each of at least one potential fail line by a number and distance attribute of at least one initial repair location. There are initial repair locations (assigned redundancy circuit locations) determined by two redundancy word lines in FIG. 4, i.e., a first initial repair location 410 and a second initial repair location 420. Both the first initial repair location 410 and the second initial repair location 420 are word lines, and a distance L1 between the first initial repair location 410 and the second initial repair location 420 is three cells. At this time, two word lines adjacent to the first initial repair location 410 are potential fail lines, and are respectively marked as: a first potential fail line 430 and a second potential fail line 440. Similarly, two word lines adjacent to the second initial repair location 420 are potential fail lines, and are respectively marked as: a third potential fail line 450 and a fourth potential fail line 460.

Figure 5:
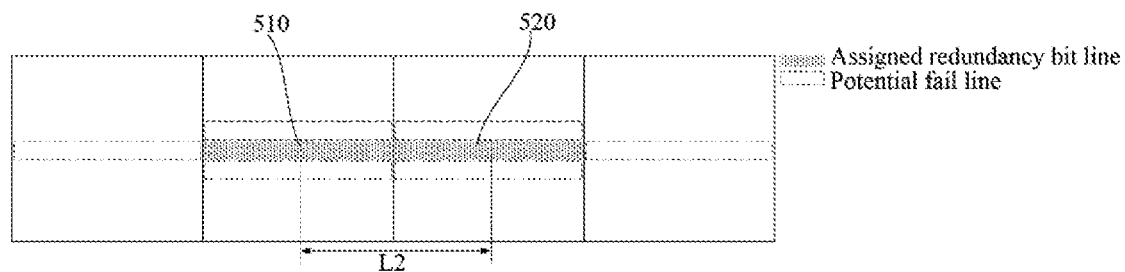
FIG. 5 schematically illustrates a second schematic diagram of determining a location of each of at least one potential fail line by a number and distance attribute of at least one initial repair location according to an exemplary embodiment of the present disclosure.

As an example, FIG. 5 schematically illustrates a second schematic diagram of determining a location of each of at least one potential fail line by a number and distance attribute of the at least one initial repair location. There are initial repair locations determined by two redundancy bit lines in FIG. 5, i.e., a third initial repair location 510 and a fourth initial repair location 520. Both the third initial repair location 510 and the fourth initial repair location 520 are bit lines and are located in two adjacent regions respectively, a distance L2 between the third initial repair location 510 and the fourth initial repair location 520 is one cell. At this time, three bit lines adjacent to the third initial repair location 510 are potential fail lines. Similarly, three bit lines adjacent to the fourth initial repair location 520 are potential fail lines.

The operation that the at least one potential fail line is determined according to the fail bit attribute of the at least one initial repair location specifically includes the following operations. At least one line where the at least one fail bit in the at least one initial repair location and at least one bit that is adjacent to the at least one fail bit and is not assigned with the redundancy circuit are located is determined as the at least one potential fail line.

Figure 6:
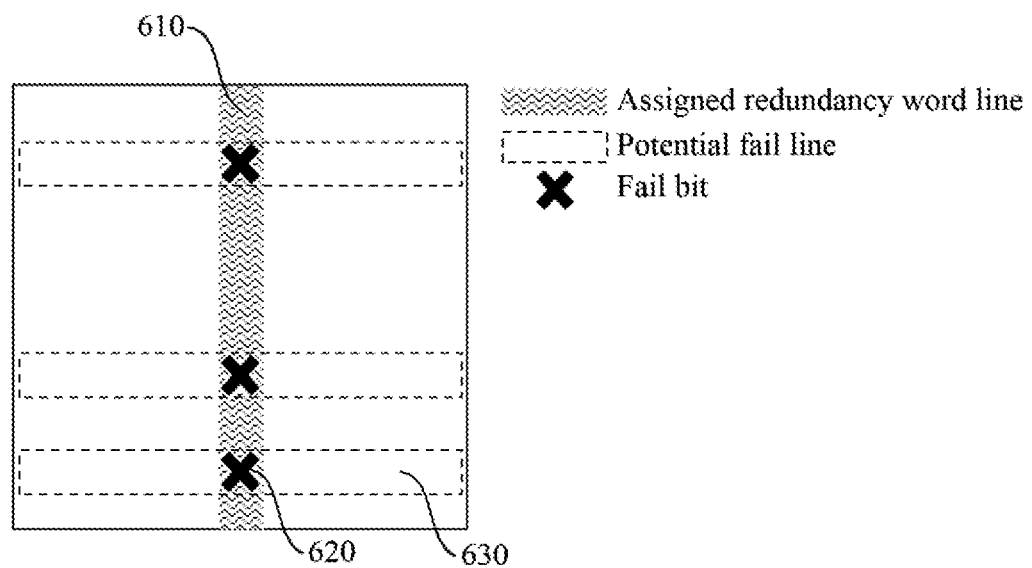
FIG. 6 schematically illustrates a first schematic diagram of determining a location of each of at least one potential fail line by a fail bit attribute according to an exemplary embodiment of the present disclosure.

As an example, FIG. 6 schematically illustrates a first schematic diagram of determining a location of each of at least one potential fail line by a fail bit attribute. There is an initial repair location 610 determined by a redundancy word line in FIG. 6, the initial repair location 610 contains three fail bits 620. For each fail bit 620, the fail bit 620 and bits that are adjacent to the fail bit 620 and are not assigned with redundancy circuits form a bit line 630. The bit line 630 is determined as a potential fail line.

Figure 7:
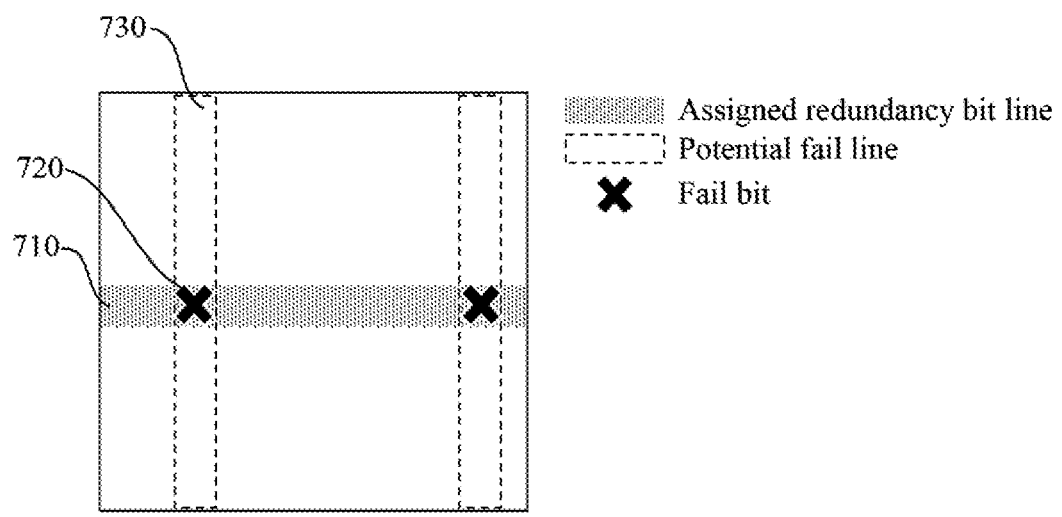
FIG. 7 schematically illustrates a second schematic diagram of determining a location of each of at least one potential fail line by a fail bit attribute according to an exemplary embodiment of the present disclosure.

As an example, FIG. 7 schematically illustrates a second schematic diagram of determining a location of each of at least one potential fail line by a fail bit attribute. There is an initial repair location 710 determined by a redundancy bit line in FIG. 7, the initial repair location 710 contains two fail bits 720. For each fail bit 720, the fail bit 720 and bits that are adjacent to the fail bit 720 and are not assigned with redundancy circuits form a word line 730. The word line 730 is determined as a potential fail line.

The above FIGS. 4 to 7 are only an example of determining at least one potential fail line according to the location attribute of the at least one initial repair location, and other initial repair location conditions can be implemented by reference, and this exemplary embodiment will not list them one by one.

At an operation S240, at least one predicted repair location is determined according to the at least one potential fail line.

In some exemplary embodiments of the present disclosure, after the at least one potential fail line is obtained through the operation S230, at least one predicted repair location can be determined on the basis of the at least one potential fail line, so as to determine a repair location with a higher probability that a new fail bit appears.

In this exemplary embodiment, the at least one predicted repair location can be determined based on a cumulative fail probability of the at least one potential fail line, and the cumulative fail probability of the at least one potential fail line can be determined based on the historical test data of a chip having a type which is the same as a type of the chip to be repaired, that is, the cumulative number of fails of each of the at least one potential fail line is determined according to the historical test data of a chip having a type which is the same as a type of the chip to be repaired, and then the cumulative fail probability is determined according to the cumulative number of fails. The at least one potential fail line is determined as the at least one predicted repair location in response to determining that the cumulative fail probability is greater than a preset value. That is to say, in response to determining that a ratio of the cumulative number of fails of a potential fail line among the at least one potential fail line to a total cumulative number of fails of the chip is greater than a preset value, the at least one potential fail line is determined as the at least one predicted repair location.

Figure 8:
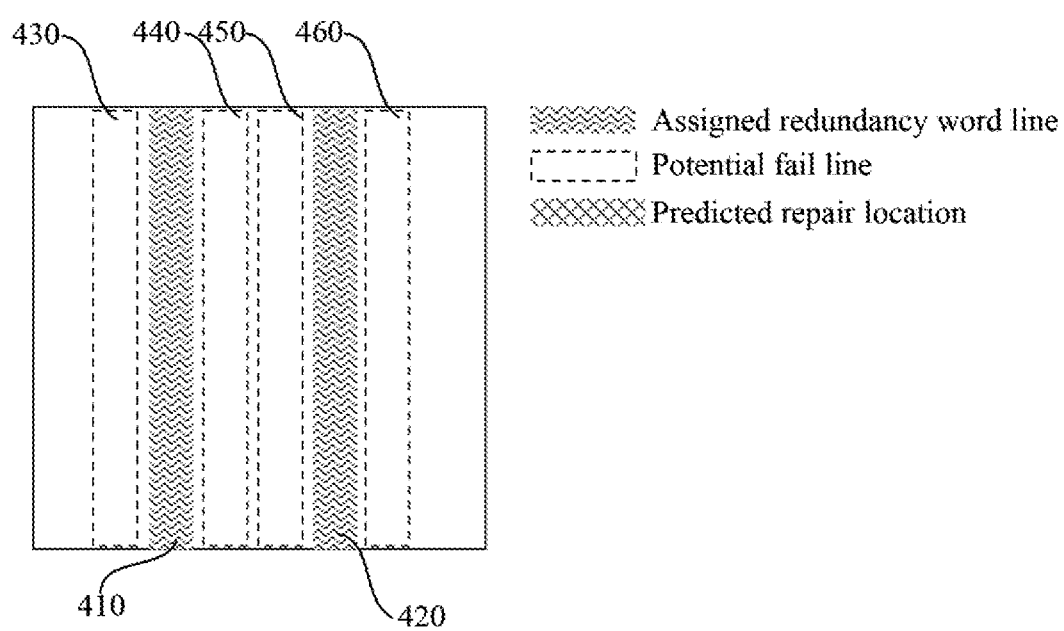
FIG. 8 illustrates a schematic diagram of a cumulative number of fails occurring at the location of each of the at least one potential fail line in FIG. 4.

For example, FIG. 8 illustrates the cumulative number of fails occurring at the location of each of the at least one potential fail line in FIG. 4. The test item (Bin) for the first initial repair location 410 is "a" or "i". The number of fail bits in the second initial repair location 420 is greater than or equal to 2, and multiple fail bits are linearly arranged, and the test item (Bin) for the second initial repair location 420 is "h".

In FIG. 8, under the condition that a total of 12521 fails occurs, 1 fail occurs in the first potential fail line 430, 100 fails occur in the second potential fail line 440, 450 fails occur in the third potential fail line 450, and 15 fails occur in the fourth potential fail line 460. That is, a probability that a fail occurs in the first potential fail line 430 is 0.008%, a probability that a fail occurs in the second potential fail line 440 is 0.799%, a probability that a fail occurs in the third potential fail line 450 is 1.038%, and a probability that a fail occurs in the fourth potential fail line 460 is 0.120%.

Figure 9:
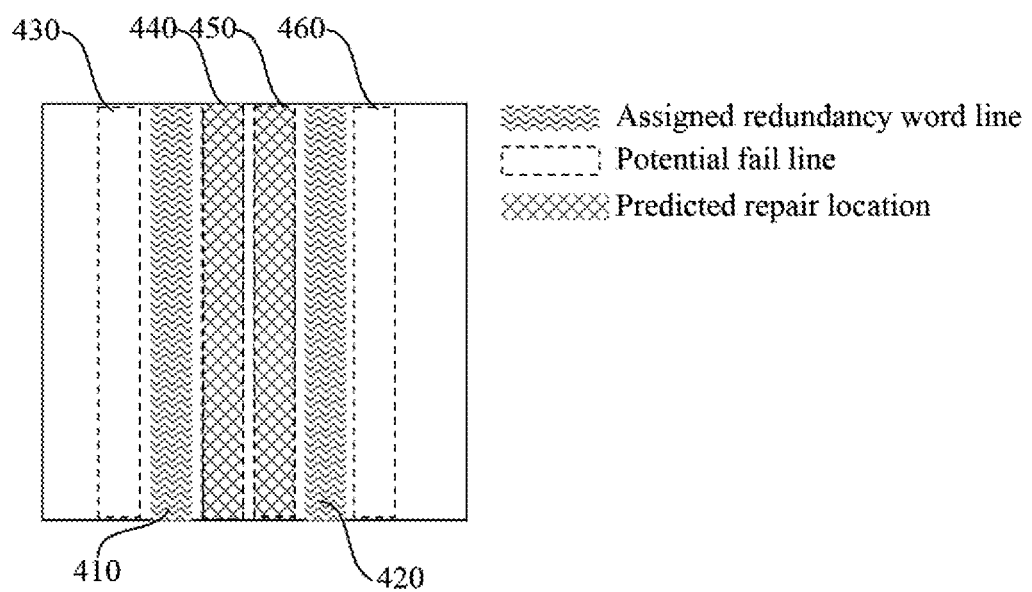
FIG. 9 illustrates a schematic diagram of at least one predicted repair location determined by the at least one potential fail line in FIG. 4.

In practical applications, the preset value can be determined according to the actual situation. For example, the preset value can be 0.5%-1%. At this time, the probability that a fail occurs in the second potential fail line 440 and the probability that a fail occurs in the third potential fail line 450 are greater than the above preset value range. Therefore, as illustrated in FIG. 9, the second potential fail line 440 and the third potential fail line 450 are determined as the predicted repair locations. This exemplary embodiment does not specifically limit the specific value of the preset value.

In some exemplary embodiments of the present disclosure, in the chip to be repaired as illustrated in FIG. 9, the at least one initial repair location has following attributes. The category of the product portfolio is DDR4 (Double Data Rate SDRAM4), and the SDRAM is a Synchronous Dynamic Random Access Memory. The type of the redundancy circuit is a redundancy word line. The number of redundancy circuits is two. The number of fail bits on each of the assigned redundancy word line is greater than or equal to 1, and the at least one test items includes multiple test items, such as "a", "i", or "h". The arrangement shape of the fail bits is as follows. The fail bits on one of the assigned redundancy word lines are of arbitrary shape, and the fail bits on the other assigned redundancy word lines are arranged in a linear. The distance between these two redundancy circuits are three bits, and the predicted repair location is the line between these two redundancy circuits, i.e., the second potential fail line 440 and the third potential fail line 450.

Figure 10:
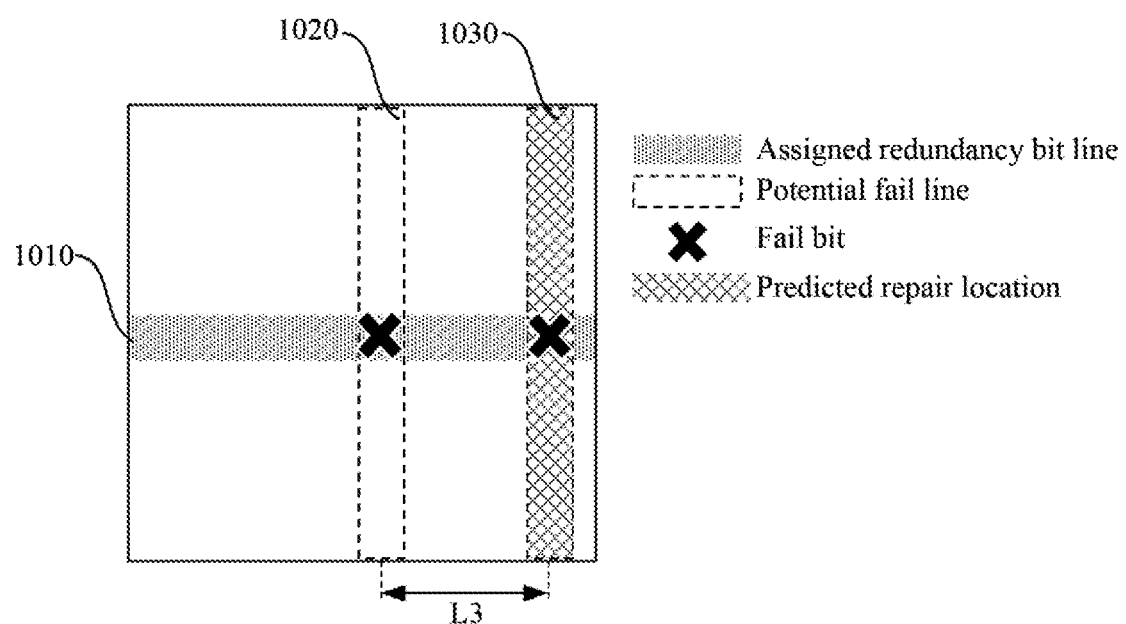
FIG. 10 schematically illustrates another schematic diagram of at least one predicted repair location determined by at least one potential fail line according to an exemplary embodiment of the present disclosure.

In some exemplary embodiments of the present disclosure, FIG. 10 schematically illustrates another schematic diagram of at least one predicted repair location determined by at least one potential fail line. The at least one initial repair location has following attributes. The category of the product portfolio is DDR4. The type of the redundancy circuit is assigned redundancy bit line 1010. The number of the redundancy circuit is one. The number of the fail bits on the assigned redundancy bit line is greater than or equal to 1, for example, two. There are multiple test items, such as {a, i}, which includes "a" or "i". The arrangement shape of the fail bits is that each fail bit is arranged in a form of a single bit, that is, the distance L3 between two fail bits is greater than 1 cell. Lines where two fail bits and at least one bit that is adjacent to any one of the two fail bits and is not assigned with the redundancy circuit are located are determined as the potential fail line 1020 and the potential fail line 1030. The at least one test item for the fail bit in the predicted repair location belongs to the test item {a,i} in the attribute. The test item for a fifth potential fail line 1030 is {a,i}, and thus the fifth potential fail line 1030 is determined as the predicted repair location.

Figure 11:
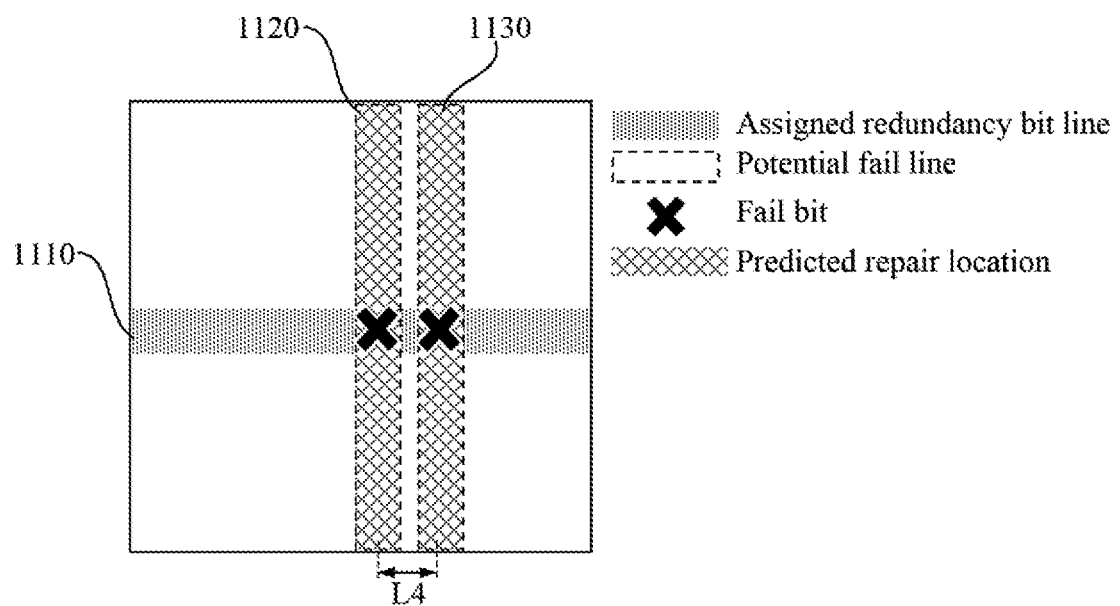
FIG. 11 schematically illustrates still another schematic diagram of at least one predicted repair location determined by at least one potential fail line according to an exemplary embodiment of the present disclosure.

In some exemplary embodiments of the present disclosure, FIG. 11 schematically illustrates another schematic diagram of at least one predicted repair location determined by at least one potential fail line. The attributes of the chip to be repaired illustrated in FIG. 11 are as follows. The category of the product portfolio is DDR4. The type of the redundancy circuit is a redundancy bit line 1110. The number of redundancy circuits is one. The number of the fail bits on the assigned redundancy bit line is greater than or equal to 2, for example, two. The at least one test item belongs to {a}, which includes "a". The arrangement shape of the fail bits is a linear, that is, a distance L4 between the two fail bits is 1 cell. There are two fail bits. For one fail bit, a line where the fail bit and at least one bit that is adjacent to the fail bit and is not assigned with the redundancy circuit are located is determined as the potential fail line 1120. For other fail bit, a line where the fail bit and at least one bit that is adjacent to the fail bit and is not assigned with the redundancy circuit are located is determined as the potential fail line 1130. In the potential fail line 1120, the at least one test item for the fail bit do not belongs to {a}, and in the potential fail line 1130, the at least one test item for the fail bit belongs to {a}. Regardless of whether the at least one test item belongs to {a} or not, the potential fail line 1120 and the potential fail line 1130 are predicted repair locations, that is, the lines with any test item are predicted repair locations.

At an operation S250, at least one final repair location for the redundancy circuit is determined according to the at least one fail bit and the at least one predicted repair location.

After the at least one predicted repair location is determined, the at least one fail bit and the at least one predicted repair location can be determined as the at least one final repair location for the redundancy circuit at the same time. In this way, a fail bit and a location where a new fail bit may appear can be repaired at the same time during repair, so that the new fail bit can be repaired before it appears, thereby reducing the probability that a new fail bits appears and improving the process yield of the chip, while improving the quality of the chip, reducing the cost of after-sales warranty, and improving the user experience.

It should be noted that although the various operations of the method in the embodiments of the present disclosure are described in a specific order in the drawings, this does not require or imply that these operations must be performed in the specific order, or that all the operations illustrated must be performed to achieve the desired result. Additionally or alternatively, some operations may be omitted, multiple operations may be combined into one operation for execution, and/or one operation may be decomposed into multiple operations for execution, etc.

Figure 12:
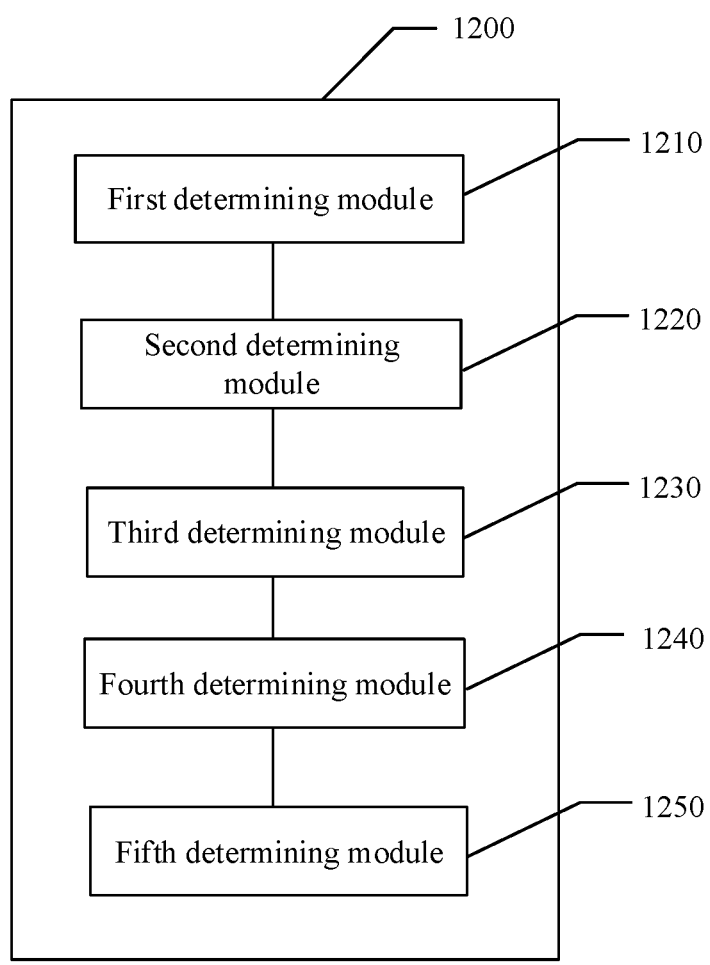
FIG. 12 schematically illustrates a block diagram of an apparatus for determining a repair location for a redundancy circuit according to an exemplary embodiment of the present disclosure.

In addition, in this exemplary embodiment, an apparatus for determining a repair location for a redundancy circuit is further provided. Referring to FIG. 12, the apparatus 1200 for determining a repair location for a redundancy circuit may include a first determining module 1210, a second determining module 1220, a third determining module 1230, a fourth determining module 1240, and a fifth determining module 1250.

The first determining module 1210 is configured to determine at least one fail bit of a chip to be repaired.

The second determining module 1220 is configured to assign at least one initial repair location for a redundancy circuit according to the at least one fail bit.

The third determining module 1230 is configured to determine at least one potential fail line according to the at least one initial repair location.

The fourth determining module 1240 is configured to determine at least one predicted repair location according to the at least one potential fail line.

The fifth determining module 1250 is configured to determine at least one final repair location for the redundancy circuit according to the at least one fail bit and the at least one predicted repair location.

The specific details of the virtual modules in the above apparatus 1200 for determining a repair location for a redundancy circuit have been described in detail in the corresponding method for determining the repair location for the redundancy circuit, and therefore will not be repeated here.

It should be noted that although several modules or cells in the apparatus for determining a repair location for a redundancy circuit are mentioned in the above detailed description, such a division is not mandatory. In fact, according to the embodiments of the present disclosure, the features and functions of two or more modules or cells described above may be embodied by one module or one cell. Conversely, the features and functions of a module or a cell described above can be further divided into and embodied by multiple modules or cells.

In addition, the above drawings are merely schematic illustrations of the processing included in the method according to the exemplary embodiments of the present disclosure, and are not intended for limitation. It is easy to understand that the processing illustrated in the above drawings does not indicate or limit the time sequence of these processing. In addition, it is also easy to understand that these processing can be executed, for example, synchronously or asynchronously in multiple modules.

Figure 13:
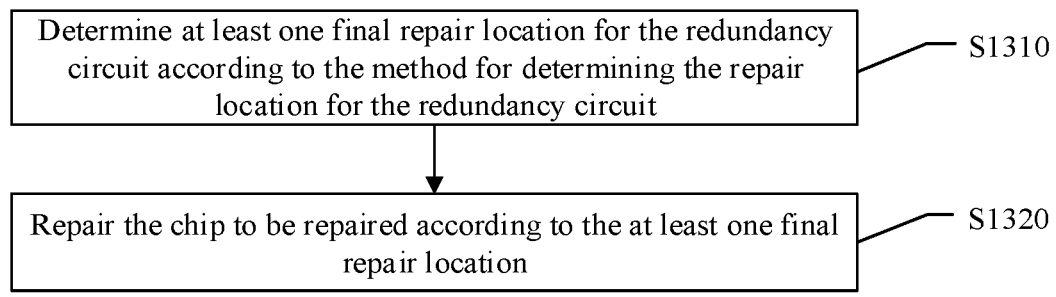
FIG. 13 schematically illustrates a schematic flow chart of a method for repairing an integrated circuit according to an exemplary embodiment of the present disclosure.

Additionally, in this exemplary embodiment, a method for repairing an integrated circuit is further provided. Referring to FIG. 13, the method for repairing an integrated circuit may include the following operations.

At an operation S1310, at least one final repair location for the redundancy circuit is determined according to the method for determining the repair location for the redundancy circuit.

At an operation S1320, a chip to be repaired is repaired according to the at least one final repair location.

According to the method for repairing an integrated circuit in this exemplary embodiment, at one aspect, the at least one final repair location including the at least one fail bit and the at least one predicted repair location where a new fail bit may appear is determined by the method for determining the repair location for the redundancy circuit, and the chip to be repaired is repaired according to the at least one final repair location, thereby reducing the probability that a new fail location appears and improving the process yield of the chip, while improving the quality of the chip, reducing the cost of after-sales warranty, and improving the user experience. At another aspect, by determining the at least one predicted repair location before the repair is performed, the at least one fail bit and the at least one location where a new fail bit may appear can be repaired at the same time, thereby saving man-hours for repairing and saving repair costs. At another aspect, the above fail bit repair solution can increase the probability that all fail bits are repaired after performing one repair, reduce the probability that fail bits in the chip cannot be repaired, thereby effectively improving the process yield of the chip and reducing the occurrence that the chip is scrapped.

In an exemplary embodiment of the present disclosure, an electronic device capable of implementing the above method is further provided.

Those skilled in the art can understand that various aspects of the embodiments of the present disclosure can be implemented as a system, a method, or a program product. Therefore, various aspects of the embodiments of the present disclosure can be specifically implemented in the following forms, namely, a complete hardware implementation, a complete software implementation (including firmware, microcode, etc.), or a combination of hardware and software, which can be collectively referred to as "circuit", "module" or "system" herein.

The electronic device 1400 according to this embodiment of the present disclosure will be described below with reference to FIG. 14. The electronic device 1400 illustrated in FIG. 14 should not bring any limitation to the function and scope of use of the embodiments of the present disclosure, but is only an example.

Figure 14:
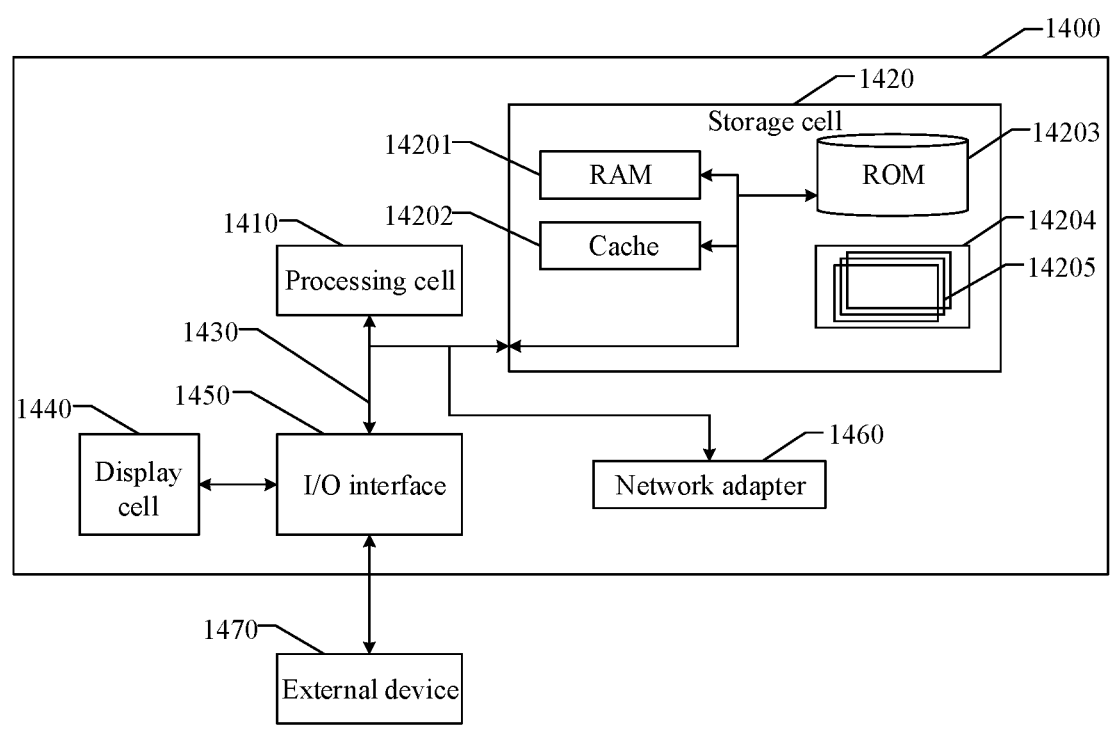
FIG. 14 schematically illustrates a schematic diagram of modules of an electronic device in an exemplary embodiment of the present disclosure.

As illustrated in FIG. 14, the electronic device 1400 is represented in the form of a general-purpose computing device. The components of the electronic device 1400 may include, but are not limited to: the above at least one processing cell 1410, the above at least one storage cell 1420, a bus 1430 connecting different system components (including the storage cell 1420 and the processing cell 1410), and a display cell 1440.

The storage cell 1420 stores program codes which can be executed by the processing cell 1410, so that the processing cell 1410 executes the operations according to various exemplary embodiments of the present disclosure described in the above "Exemplary Method" section of this specification. For example, the processing cell 1410 may execute following operations. The operation S210 as illustrated in FIG. 4 of determining the at least one fail bit of the chip to be repaired. The operation S220 of assigning at least one initial repair location for the redundancy circuit according to the at least one fail bit. The operation S230 of determining at least one potential fail line according to the at least one initial repair location. The operation S240 of determining at least one predicted repair location according to the at least one potential fail line. The operation S250 of determining at least one final repair location for the redundancy circuit according to the at least one fail bit and the at least one predicted repair location. The operation S1320 of repairing a chip to be repaired according to the at least one final repair location.

The storage cell 1420 may include a readable medium in the form of a volatile storage cell, such as a random access storage cell (RAM) 14201 and/or a cache storage cell 14202, and may further include a read-only storage cell (ROM) 14203.

The storage cell 1420 may also include a program/utility tool 14204 having a set of (at least one) program modules 14205. Such program modules 14205 include but are not limited to: an operating system, one or more application programs, other program modules, and program data. Each of these examples or some combination of these examples may include the implementation of a network environment.

The bus 1430 may be one or more of several types of bus structures. The bus 1430 includes a storage cell bus or a storage cell controller, a peripheral bus, a graphics acceleration port, a processing cell, or a local bus using any bus structure among multiple bus structures.

The electronic device 1400 may also communicate with one or more external devices 1470 (such as keyboards, pointing devices, Bluetooth devices, etc.), and may also communicate with one or more devices that enable a user to interact with the electronic device 1400, and/or communicate with any device (such as a router, modem, etc.) that enables the electronic device 1400 to communicate with one or more other computing devices. This communication can be performed through an input/output (I/O) interface 1450. In addition, the electronic device 1400 may also communicate with one or more networks (for example, a local area network (LAN), a wide area network (WAN), and/or a public network, such as the Internet) through the network adapter 1460. As illustrated in the figure, the network adapter 1460 communicates with other modules of the electronic device 1400 through the bus 1430. It should be understood that although not illustrated in the figure, other hardware and/or software modules can be used in combination with the electronic device 1400, including but not limited to: a microcode, a device driver, a redundant processing cell, an external disk drive array, an RAID system, a tape drive and a data backup storage system, etc.

By the description of the above embodiments, those skilled in the art can easily understand that the exemplary embodiments described here can be implemented by software, or can be implemented by combining software with necessary hardware. Therefore, the technical solution according to the embodiments of the present disclosure can be embodied in the form of a software product, which can be stored in a non-volatile storage medium (which can be a CD-ROM, a U disk, a mobile hard disk, etc.) or on the network, including several instructions, to make a computing device (which can be a personal computer, a server, a terminal apparatus, or a network device, etc.) execute the method according to the embodiments of the present disclosure.

In the exemplary embodiments of the present disclosure, a computer-readable storage medium having stored thereon a program product capable of implementing the above method in this specification is further provided. In some possible implementations, various aspects of the embodiments of the present disclosure may also be implemented in the form of a program product, which includes program code, and when the program product runs on a terminal device, the program code is used to cause the terminal device to execute the operations according to various exemplary embodiments of the present disclosure described in the above "Exemplary Method" section of this specification.

Figure 15:
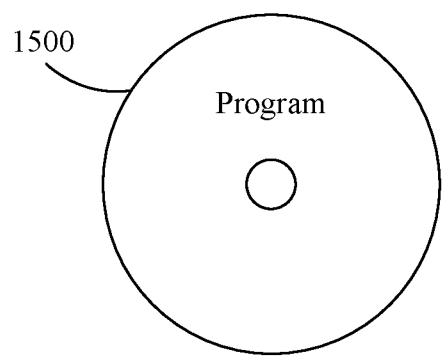
FIG. 15 schematically illustrates a schematic diagram of a program product in an exemplary embodiment according to the present disclosure.

Referring to FIG. 15, a program product 1500 for implementing the above method according to an implementation of an embodiment of the present disclosure is described. The program product can adopt a portable compact disk read-only memory (CD-ROM) and include program code, and can be run on the terminal device, such as a personal computer. However, the program product of embodiments of the present disclosure is not limited thereto. In this document, the readable storage medium can be any tangible medium that contains or stores a program, and the program can be used by or in combination with an instruction execution system, an apparatus, or a component.

The program product can use any combination of one or more readable media. The readable medium may be a readable signal medium or a readable storage medium. The readable storage medium may be, for example, but not limited to, an electrical, magnetic, optical, electromagnetic, infrared, or semiconductor system, apparatus, or component, or a combination of any of the above. More specific examples (non-exhaustive list) of readable storage media include: electrical connections with one or more wires, portable disks, hard disks, random access memory (RAM), read-only memory (ROM), erasable programmable read-only memory (EPROM or flash memory), optical fiber, portable compact disk read-only memory (CD-ROM), optical storage component, magnetic storage component, or any suitable combination of the above.

The computer-readable signal medium may include a data signal propagated in baseband or as a part of a carrier wave, and readable program code is carried therein. This propagated data signal can take many forms, including but not limited to electromagnetic signals, optical signals, or any suitable combination of the above. The readable signal medium may also be any readable medium other than a readable storage medium, and the readable medium may send, propagate, or transmit a program for use by or in combination with the instruction execution system, apparatus, or component.

The program code contained on the readable medium can be transmitted by any suitable medium, including but not limited to wireless, wired, optical cable, RF, etc., or any suitable combination of the above.

The program code used to perform the operations of the embodiments of the present disclosure can be written in any combination of one or more programming languages. The programming languages include object-oriented programming languages, such as Java, C++, etc., as well as the conventional procedural programming language, such as "C" language or similar programming language. The program code can be executed entirely on the user's computing device, partly on the user's device, executed as an independent software package, partly on the user's computing device and partly executed on the remote computing device, or entirely on the remote computing device or server. In the case of remote computing devices, the remote computing device can be connected to the user computing device through any kind of network, including a local area network (LAN) or a wide area network (WAN), or it can be connected to an external computing device (for example, connecting via the Internet by an Internet service provider).

Moreover, the above drawings are merely schematic illustrations of the processing included in the method according to the exemplary embodiments of the present disclosure, and are not intended for limitation. It is easy to understand that the processing illustrated in the above drawings does not indicate or limit the time sequence of these processing. In addition, it is also easy to understand that these processing can be executed, for example, synchronously or asynchronously in multiple modules.

Those skilled in the art would easily conceive of other embodiments of the present disclosure after considering the specification and practicing the invention disclosed herein. This application is intended to cover any variations, uses, or adaptive changes of the present disclosure, which follow the general principles of the present disclosure and include common technical knowledge or commonly-used technical means in the technical field that are not disclosed in the present disclosure. The specification and the embodiments are only regarded as exemplary, and the true scope and spirit of the present disclosure are pointed out by the claims.

It should be understood that the present disclosure is not limited to the precise structure that has been described above and illustrated in the drawings, and various modifications and changes can be made without departing from its scope. The scope of the present disclosure is limited only by the appended claims.

What is claimed is:

1. A method for determining a repair location for a redundancy circuit, comprising:
    determining at least one fail bit of a chip to be repaired, wherein the at least one fail bit is detected by testing;
    assigning at least one initial repair location for the redundancy circuit according to the detected at least one fail bit;
    determining at least one potential fail line according to the at least one initial repair location;
    determining at least one predicted repair location according to the at least one potential fail line, wherein the at least one predicted repair location is at least one location of the chip to be repaired at which at least one fail bit appears after repairing of the detected at least one fail bit based on the at least one initial repair location for the redundancy circuit; and
    determining at least one final repair location for the redundancy circuit according to the at least one fail bit and the at least one predicted repair location.

2. The method for determining the repair location for the redundancy circuit of claim 1, wherein determining the at least one potential fail line according to the at least one initial repair location comprises:
    determining the at least one potential fail line according to a location attribute of the at least one initial repair location.

3. The method for determining the repair location for the redundancy circuit of claim 2, wherein determining the at least one potential fail line according to the location attribute of the at least one initial repair location comprises:
    determining the at least one potential fail line according to at least one of a number and distance attribute of the at least one initial repair or a fail bit attribute of the at least one initial repair location.

4. The method for determining the repair location for the redundancy circuit of claim 3, wherein determining the at least one potential fail line according to the number and distance attribute of the at least one initial repair location comprises:
    in response to determining that a number of initial repair locations which serve as word lines or bit lines among the at least one initial repair location is greater than or equal to two and a distance between two adjacent initial repair locations among the initial repair locations is less than or equal to three cells, determining at least one word line or at least one bit line adjacent to any one of the two adjacent initial repair locations as the at least one potential fail line.

5. The method for determining the repair location for the redundancy circuit of claim 3, wherein determining the at least one potential fail line according to the at least one fail bit attribute of the at least one initial repair location comprises:
    determining, as the at least one potential fail line, at least one line where the at least one fail bit in the at least one initial repair location and at least one bit that is adjacent to the at least one fail bit and is not assigned with the redundancy circuit are located.

6. The method for determining the repair location for the redundancy circuit of claim 1, wherein determining the at least one predicted repair location according to the at least one potential fail line comprises:
    determining the at least one predicted repair location according to a cumulative fail probability of the at least one potential fail line.

7. The method for determining the repair location for the redundancy circuit of claim 6, wherein determining the at least one predicted repair location according to the cumulative fail probability of the at least one potential fail line comprises:
    determining a cumulative number of fails of each of the at least one potential fail line according to historical test data of a chip having a type which is the same as a type of the chip to be repaired; and
    in response to determining that a ratio of the cumulative number of fails of a potential fail line among the at least one potential fail line to a total cumulative number of fails of the chip is greater than a preset value, determining the at least one potential fail line as the predicted repair location.

8. The method for determining the repair location for the redundancy circuit of claim 2, wherein the location attribute comprises: a category of a product portfolio, a type of the redundancy circuit, a number of fail bits, at least one test item, and an arrangement shape of the fail bits.

9. The method for determining the repair location for the redundancy circuit of claim 8, wherein determining the at least one potential fail line according to the location attribute of the at least one initial repair location comprises:
    in response to determining that the category of the product portfolio is Double Data Rate Synchronous Dynamic Random Access Memory 4 (DDR4), the type of the redundancy circuit is a redundancy bit line, the number of fail bits is greater than or equal to 1, the at least one test item comprises a plurality of test items, and the arrangement shape of the fail bits is that each fail bit is arranged in a form of a single bit, determining, as the at least one potential fail line, at least one line where the fail bits and at least one bit that is adjacent to the fail bits and is not assigned with the redundancy circuit are located.

10. The method for determining the repair location for the redundancy circuit of claim 9, wherein determining the at least one predicted repair location according to the at least one potential fail line comprises:
    the at least one predicted repair location is a potential fail line whose test item belongs to a test item of the at least one initial repair location among the at least one potential fail line.

11. The method for determining the repair location for the redundancy circuit of claim 8, wherein determining the at least one potential fail line according to the location attribute of the at least one initial repair location comprises:

in response to determining that the category of the product portfolio is Double Data Rate Synchronous Dynamic Random Access Memory 4 (DDR4), the type of the redundancy circuit is a redundancy bit line, the number of fail bits is 1, the at least one test item comprises one test item, and the arrangement shape of the fail bits is that the fail bits are arranged in a line shape, determining, as the at least one potential fail line, at least one line where the fail bits and at least one bit that is adjacent to the fail bits and is not assigned with the redundancy circuit are located.

12. The method for determining the repair location for the redundancy circuit of claim 11, wherein determining the at least one predicted repair location according to the at least one potential fail line comprises:

the at least one predicted repair location is a potential fail line whose test item belongs to any test item among the at least one potential fail line.

13. A method for repairing an integrated circuit, comprising:

determining at least one final repair location for a redundancy circuit according to the method for determining the repair location for the redundancy circuit of claim 1; and repairing a chip to be repaired according to the at least one final repair location.

14. A non-transitory computer-readable storage medium having stored thereon a computer program that, when executed by a processor, causes the processor to:

determine at least one fail bit of a chip to be repaired, wherein the at least one fail bit is detected by testing;

assign at least one initial repair location for the redundancy circuit according to the detected at least one fail bit;

determine at least one potential fail line according to the at least one initial repair location;

determine at least one predicted repair location according to the at least one potential fail line, wherein the at least one predicted repair location is at least one location of the chip to be repaired at which at least one fail bit appears after repairing of the detected at least one fail bit based on the at least one initial repair location for the redundancy circuit; and determine at least one final repair location for the redundancy circuit according to the at least one fail bit and the at least one predicted repair location.

15. An electronic device, comprising:
a processor; and
a memory, configured to store one or more programs that, when executed by the processor, cause the processor to:

determine at least one fail bit of a chip to be repaired, wherein the at least one fail bit is detected by testing;

assign at least one initial repair location for the redundancy circuit according to the detected at least one fail bit;

determine at least one potential fail line according to the at least one initial repair location;

determine at least one predicted repair location according to the at least one potential fail line, wherein the at least one predicted repair location is at least one location of the chip to be repaired at which at least one fail bit appears after repairing of the detected at least one fail bit based on the at least one initial repair location for the redundancy circuit; and determine at least one final repair location for the redundancy circuit according to the at least one fail bit and the at least one predicted repair location.

16. The electronic device of claim 15, wherein the processor is further configured to:

determine the at least one potential fail line according to a location attribute of the at least one initial repair location.

17. The electronic device of claim 16, wherein the processor is further configured to:

determine the at least one potential fail line according to at least one of a number and distance attribute of the at least one initial repair or a fail bit attribute of the at least one initial repair location.

18. The electronic device of claim 17, wherein the processor is further configured to:

in response to determining that a number of initial repair locations which serve as word lines or bit lines among the at least one initial repair location is greater than or equal to two and a distance between two adjacent initial repair locations among the initial repair locations is less than or equal to three cells, determine at least one word line or at least one bit line adjacent to any one of the two adjacent initial repair locations as the at least one potential fail line.

19. The electronic device of claim 17, wherein the processor is further configured to:

determine, as the at least one potential fail line, at least one line where the at least one fail bit in the at least one initial repair location and at least one bit that is adjacent to the at least one fail bit and is not assigned with the redundancy circuit are located.

20. The electronic device of claim 15, wherein the processor is further configured to:

determine the at least one predicted repair location according to a cumulative fail probability of the at least one potential fail line.

* * * * *